United States Patent [19]
Hsieh et al.

[11] Patent Number: 6,074,941
[45] Date of Patent: Jun. 13, 2000

[54] METHOD OF FORMING A VIA WITH PLASMA TREATMENT OF SOG

[75] Inventors: Ching-Hsing Hsieh, Pingtung Hsien; William Lu, Taichung; Chih-Ching Hsu, Hsinchu; Yung-Chieh Kuo, Taipei, all of Taiwan

[73] Assignee: United Semiconductor Corp., Hsinchu, Taiwan

[21] Appl. No.: 09/113,471

[22] Filed: Jul. 10, 1998

[30] Foreign Application Priority Data

Apr. 20, 1998 [TW] Taiwan .................................. 87105995

[51] Int. Cl.$^7$ ............................................... H01L 21/4763
[52] U.S. Cl. .......................... 438/624; 438/626; 438/637; 438/672; 438/782

[58] Field of Search .................................. 438/782, 624, 438/672, 626, 637

[56] References Cited

U.S. PATENT DOCUMENTS 5,883,014   3/1999   Chen et al. ............................... 438/782

*Primary Examiner*—John F. Niebling
*Assistant Examiner*—Lynne Gurley
*Attorney, Agent, or Firm*—Thomas, Kayden, Horstemeyer & Risley

[57] ABSTRACT

A method of forming a via is provided comprising a plasma treatment at the spin-on-glass layer after forming the unlanding via. The plasma comprises hydrogen and a second gas. The mist containing in the spin-on-glass layer is damaged and removed away.

14 Claims, 3 Drawing Sheets

6,074,941

METHOD OF FORMING A VIA WITH PLASMA TREATMENT OF SOG

CROSS-REFERENCE TO RELATED APPLICATION

This application claims the priority benefit of Taiwan application Ser. No. 87105995, filed Apr. 20, 1998, the full disclosure of which is incorporatd herein by reference.

BACKGROUND OF THE INVENTION

1. Field of the Invention

The present invention relates in general to a method for forming integrated circuits (ICs) including vias and vertical interconnects formed at least partially through spin-on-glass (SOG). More particularly, the present invention relates to improves the outgassing of a SOG layer exposed within a via.

2. Description of the Related Art

Many highly integrated semiconductor circuits utilize vias for the formation of multilevel interconnections within regions of a device or between devices in an integrated circuit. A conventional method is provided to form such structures. It comprises a step of forming a first level wiring line; a step of depositing an inter-metal dielectric layer over the wiring line; a step of forming a via through the inter-metal dielectric layer to expose a portion of the first level wiring linen and a step of depositing a metal into the via to form a vertically extending interconnect or a "plug". Then, a second level of wiring lines is formed on the inter-metal dielectric layer, with the plug connecting the first level wiring line to one of the other conductors in the circuit.

The inter-metal dielectric layer proved between wiring line layers often includes one or more layers with a spin-on-glass (SOG) material. In general, SOG films can provides better coverage to fill narrow gaps than a chemical vapor deposited (CVD) film. The spin-on-glass material is mixed with a solvent and then deposited onto and spread uniformly over a wafer surface by applying the mixture while the wafer is spinning. The mixture of the SOG material fills openings in the surface, such as the troughs between wiring lines, and yields a layer having a planar surface. Baking and curing steps are then carried out to drive off the solvent and to cure the SOG material. More than one layer of SOG may be deposited prior to the curing step in order to obtain the desired thickness and because multi-layer processes are more effective at planarizing a upper surface.

SOG layer are often used in a sandwich-type structure in which a CVD dielectric layer is deposited over a structure, an SOG layer is deposited over the CVD dielectric layer and another CVD dielectric layer is deposited over the SOG layer. Several variations on the SOG sandwich-type structure are known.

FIGS. 1A–1D illustrate the etching-back method. Referring to FIG. 1A, a first CVD dielectric layer 104 is formed over a substrate 100 having structures such as wiring lines 102 thereon. Since the substrate 100 has structures such as wiring lines 102 thereon, the first CVD dielectric layer 104 has a bumpy upper surface and has troughs 106 between the wiring lines 102.

Referring to FIG. 1B, a SOG layer 108 is then formed over the first CVD dielectric layer 104. The SOG layer 108 is then etched back so that the SOG layer 108' remains only in the troughs 106 between the wiring lines 102. A portion of the first CVD dielectric layer 104 may also be etched back over the wiring lines 102 to insure that no SOG remains over the wiring lines 102.

Referring to FIG. 1C, a second CVD dielectric layer 110 is then deposited over the etched back surface to form a sandwich-type structure. Conventional photolithography may then be carried out to form a via mask over the second CVD dielectric layer 110, and a via 112 is formed by anisotropically etching through the openings in the mask and through the CVD dielectric layers 104 and 110. Typically a plasma etchant is used. As shown in FIG. 1C, there is no SOG layer 108 directly contacting the via 112.

The SOG layer 108 may be exposed during via forming as shown in FIG. 1D. No matter the mask alignment or process errors, portion of the via is formed on the conner of the wire line 102 cause the opening of the mask sway the position respecting the wire line 102. It means that an unlanding via 112' is formed at the shoulder between the first dielectric layer 104 and the wire line 102. When the via etching process uses the upper surface of the wire line 102 as a stop layer, the unlanding via may reach along the side wall of the wire line 102 and into the first dielectric layer 104 to form a cavity connecting the wire line 102.

The structure described above is known to outgas and to "poison" the via 112 during subsequent processing steps such as metal plug deposition. The outgassing causes defects to form within the via, often at the interface between the metal within the via and the metal layer directly beneath or directly above the via 112. The defect may be caused by oxidation of the plug metal. Such defects lead to higher and/or varying resistances and lower product yields. The etching-back method avoids the poisoned via problem because the SOG layer is not exposed after via formation.

Due to the problems with the etching-back method, processes for reducing the poisoned via problem have been proposed. One conventional method for reducing the risk of poisoned via formation is to heat the wafer in a furnace to bake out the exposed SOG layer within the via. The heat treatment includes heating the structure for 4–6 hours at 300–500° C. in a tube furnace after forming the vias to outgas the exposed SOG surface. After the heat treatment, the wafers are taken out of the furnace, allowed to cool in the ambient atmosphere, and loaded into a deposition chamber for subsequent processing steps including deposition of a plug material into the via for connecting different level wiring lines. U.S. Pat. No. 5,003,062 to Yen suggests that outgasing can be accomplished in shorter times than 4–6 hours if vacuum conditions are maintained during the heat treatment step.

Still other methods propose forming spacers over the exposed SOG surface in the vias to prevent outgassing during subsequent processing steps. Forming spacers within the via, however adds to the number of processing steps and the complexity of the process.

Also a method of using sputter degas is carrier out to remove the mist in the SOG layer. But the method can remove the mist only on the SOG surface, it can't remove the interior mist in the SOG layer.

Additionally another method of SOG implantation is used after forming the SOG layer and before forming the second dielectric layer. The mist in the SOG layer is removed by implanting, but a condition of deficient implanting depth normally happens. When a unlanding via is formed and the inner SOG is exposed, the mist still poisons the via.

SUMMARY OF THE INVENTION

It is therefore the object of the invention to provide a method of forming a via. The method treats the SOG layer by using plasma with fixed ratio of hydrogen and another gas. The another gas can damage the waterish SOG layer, and active hydrogen radicals in hydrogen can take the mist away.

The invention achieves the above-identified objects by providing a Method of forming a via. After the unlanding via is formed, using plasma with fixed ratio of hydrogen and another gas treats the exposed SOG layer. The mist in the SOG layer is taken away to resolve the problem of via poison and to prevent the plug filled in the via from the mist contamination. The method can maintain the devices efficiency and the yield.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
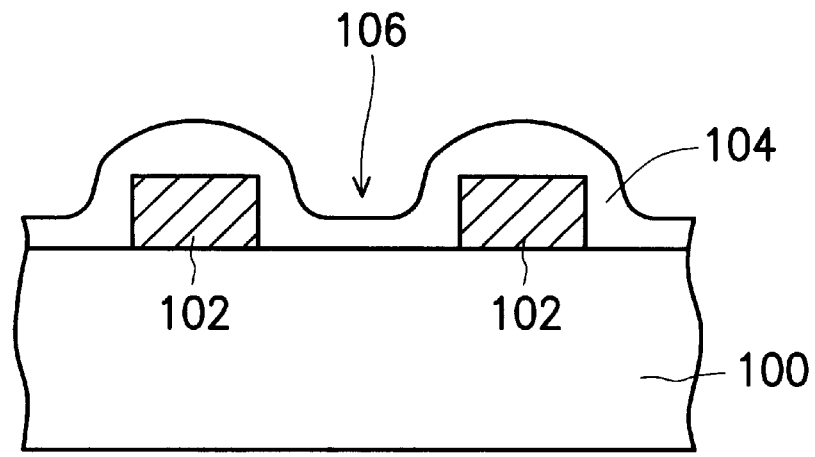
FIGS. 1A–1D illustrate steps in a conventional etching back method for forming a sandwich-type structure having an SOG layer therein.
Figure 1B:
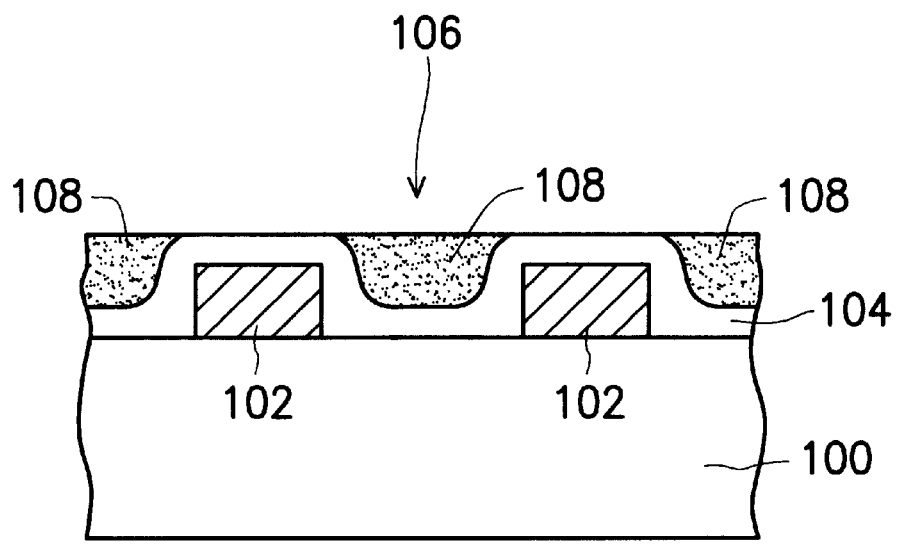
Figure 1C:
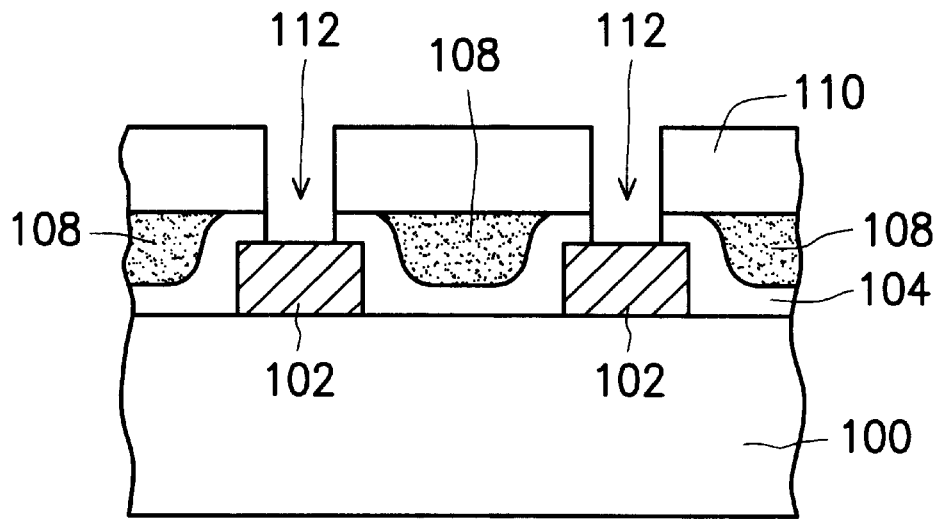
Figure 1D:
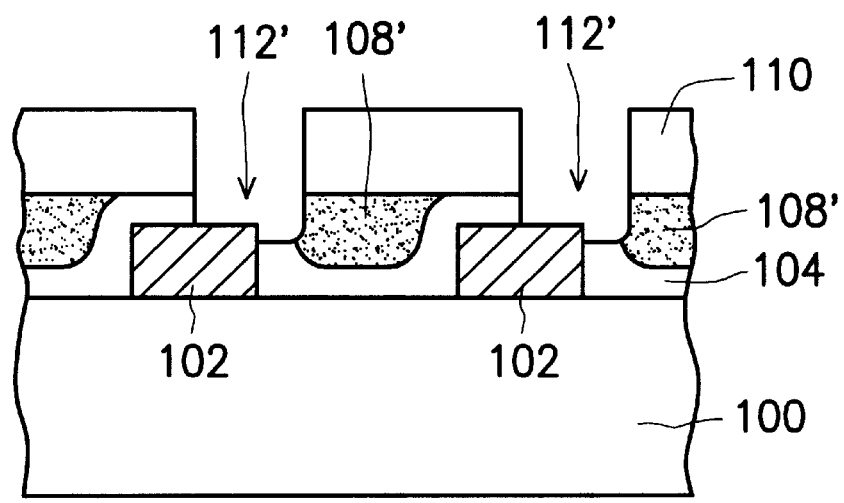
Figure 2:
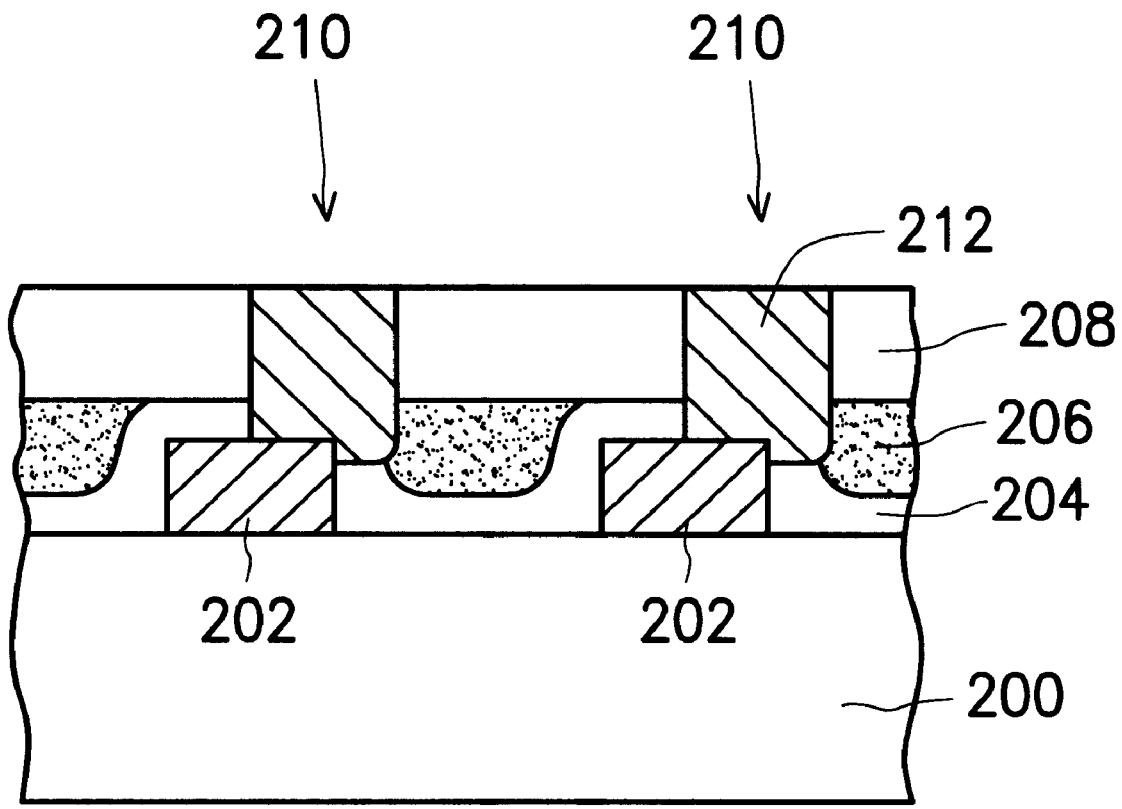
FIG. 2 is a cross-sectional view showing the process steps of one preferred embodiment of the method of forming a via.

Referring to FIG. 2, a semiconductor substrate 200 is provided. A conductive structure 202 is formed on the semiconductor substrate 200. Then, a first dielectric layer 204 is formed over the conductive structure 202 and the semiconductor substrate 200. A SOG layer 206 is formed, baked and cured on the first dielectric layer 204. A second dielectric layer 208 is formed on the structure described above. The first dielectric layer 204 and the second dielectric layer 208 are formed by plasma enhanced chemical vapor deposition. The TEOS gas is used as a reactive precursor.

A photolithography and etching process is carrier out to form a via 210 exposing the conductive structure 202 through the first dielectric layer 204 and the second dielectric layer 208, wherein the via 210 is an unlanding via.

After forming the via 210, a plasma treatment is executed at the via 210. The plasma comprises hydrogen and a second gas, for example, nitrogen, argon or a mixture of nitrogen and argon which can damage mist in the SOG layer. The step of plasma treatment damages the waterish SOG layer by plasma from another gas. The mist and the other impurities in the SOG layer are removed by using active hydrogen radicals from the hydrogen plasma. The step can resolve the via poison formed during the SOG process. After this a metal plug filled in the via is formed to finish the interconnect structure.

One feature of the invention is treating the waterish SOG layer by using plasma with fixed ratio of hydrogen and a second gas. The waterish SOG layer is damaged under the destructive plasma. Then, the mist and other impurities are removed away by active hydrogen radicals in the hydrogen plasma.

Another feature of the invention is providing a Method of forming a via. Outgassing under a plasma can reduce the steps in the process and curtail the step of implantation, the step of heating the SOG layer in a furnace and the step of sputtering degas to reduce the cycle time of the process. Furthermore, the method can remove all mist in the SOG layer to avoid some mist remained in the inner SOG as shown in the conventional processes.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a via using a treatment process on a spin-on-glass, wherein the via is formed in an inter-metal dielectric layer comprising at least one spin-on-glass layer, the method comprising:

performing a plasma treatment with a mixture of gases on the exposing spin-on-glass layer in the via, wherein the mixture of gases has a fixed ratio.

2. A method according to claim 1, wherein the mixture of gas comprises hydrogen and a second gas having a destructibility of mist.

3. A method according to claim 2, wherein the gas having a destructibility of mist comprises nitrogen.

4. A method according to claim 3, wherein the gas having a destructibility of mist comprises argon.

5. A method according to claim 2, wherein the gas having a destructibility of mist comprises argon and nitrogen.

6. A method of forming a via, wherein a problem of via poisoning is resolved, the method comprising the steps of:

providing a semiconductor substrate, wherein a conductive structure, a first dielectric layer, a spin-on-glass layer and a second dielectric layer are sequentially formed on the semiconductor substrate;

partially removing the second dielectric layer and the first dielectric layer to form a via exposing part of the conductive structure and of the spin-on-glass layer; and after forming the via, performing a plasma treatment with a mixture of gases at the exposing spin-on-glass layer in the via, wherein the mixture of gases has a fixed ratio.

7. A method according to claim 6, wherein the mixture gas plasma comprises hydrogen and a second gas having a destructibility of mist.

8. A method according to claim 7, wherein the gas having a destructibility of mist comprises nitrogen.

9. A method according to claim 7, wherein the gas having a destructibility of mist comprises argon.

10. A method according to claim 7, wherein the gas having a destructibility of mist comprises argon and nitrogen.

11. The method according to claim 6, wherein the via also exposes a portion of the spin-on-glass layer.

12. A method of forming a via, the method comprising the steps of:

providing a semiconductor substrate, wherein a conductive structure, a first dielectric layer, a spin-on-glass layer and a second dielectric layer are sequentially formed on the semiconductor substrate;

partially removing the second dielectric layer and the first dielectric layer to form a via exposing part of the conductive structure and of the spin-on-glass layer; and after forming the via, performing a plasma treatment with a mixture of gases comprising hydrogen and nitrogen on the exposing spin-on-glass layer in the via, wherein the mixture of hydrogen and nitrogen has a fixed ratio.

13. A method of forming a via, the method comprising the steps of:

providing a semiconductor substrate, wherein a conductive structure, a first dielectric layer, a spin-on-glass layer and a second dielectric layer are sequentially formed on the semiconductor substrate;

partially removing the second dielectric layer and the first dielectric layer to form a via exposing part of the conductive structure and of the spin-on-glass layer; and after forming the via, performing a plasma treatment with a mixture of gases comprising hydrogen and argon on the exposing spin-on-glass layer in the via, wherein the mixture of hydrogen and argon has a fixed ratio.

14. A method of forming a via, the method comprising the steps of:

providing a semiconductor substrate, wherein a conductive structure, a first dielectric layer, a spin-on-glass layer and a second dielectric layer are sequentially formed on the semiconductor substrate;

partially removing the second dielectric layer and the first dielectric layer to form a via exposing part of the conductive structure and of the spin-on-glass layer; and after forming the via, performing a plasma treatment with a mixture of gases comprising hydrogen, nitrogen and argon on the exposing spin-on-glass layer in the via, wherein the mixture of hydrogen, nitrogen and argon has a fixed ratio.

\* \* \* \* \*